United States Patent
Ishii

[19]

[11] Patent Number: 6,154,070
[45] Date of Patent: Nov. 28, 2000

[54] CONTROL CIRCUIT AND SEMICONDUCTOR INTEGRATED CIRCUIT DEVICE

[75] Inventor: Toshiki Ishii, Chiba, Japan

[73] Assignee: Seiko Instruments Inc., Japan

[21] Appl. No.: 09/054,325

[22] Filed: Apr. 2, 1998

[30] Foreign Application Priority Data

Apr. 3, 1997 [JP] Japan ................................ 9-085372
Mar. 4, 1998 [JP] Japan ................................ 10-052479

[51] Int. Cl.$^7$ ........................................... H03L 7/00
[52] U.S. Cl. ........................ 327/143; 327/198; 327/7; 327/12
[58] Field of Search ..................... 327/12, 2, 3, 7, 327/142, 143, 198; 326/94, 156, 150, 159

[56] References Cited

U.S. PATENT DOCUMENTS

| | | | |
|---|---|---|---|
| 3,947,697 | 3/1976 | Archer et al. ............................ | 327/142 |
| 4,451,794 | 5/1984 | Yamada ................................... | 327/8 |
| 4,600,845 | 7/1986 | Mckenna .................................. | 327/3 |
| 5,122,694 | 6/1992 | Bradford et al. ....................... | 327/142 |
| 5,550,878 | 8/1996 | Shiraki .................................... | 375/373 |

*Primary Examiner*—Timothy P. Callahan
*Assistant Examiner*—An T. Luu
*Attorney, Agent, or Firm*—Adams & Wilks

[57] ABSTRACT

To form a means preventing a logic circuit from outputting wrong data at uncontrolled, unstable state of power turn-on in a control circuit. The control circuit has two logic circuits therein and takes negative OR or negative AND of output thereof. A first input terminal is connected to an input of an inverter circuit and a second logic circuit; the output of the inverter circuit is connected to the input of the first logic circuit; a second input terminal is connected to the first logic circuit and the second logic circuit; outputs of the first logic circuit and the second logic circuit are connected to inputs of a gate circuit; the output of the gate circuit is connected to a output terminal; and the first logic circuit and the second logic circuit output the opposite level to each other, positive and negative.

38 Claims, 4 Drawing Sheets

F I G. 1
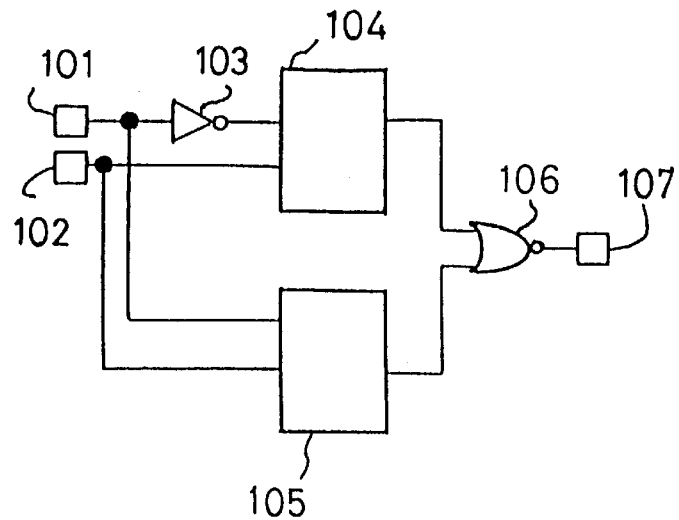
F I G. 2
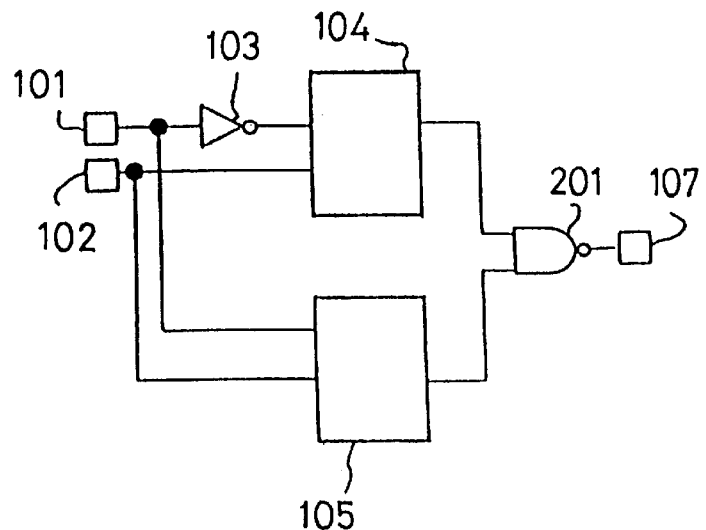
F I G. 3
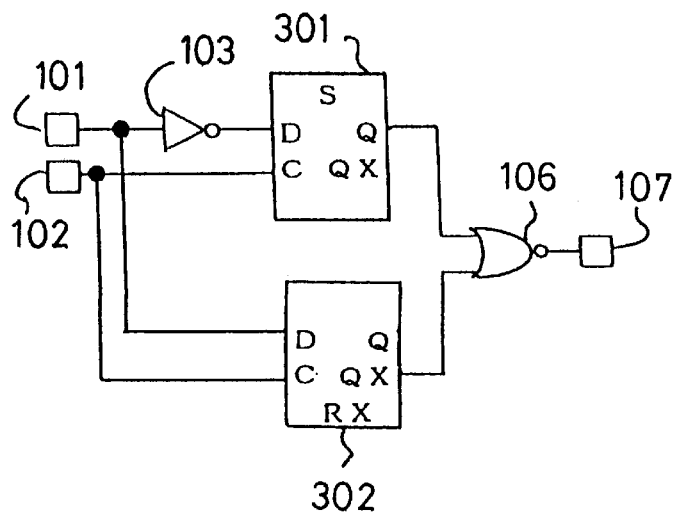

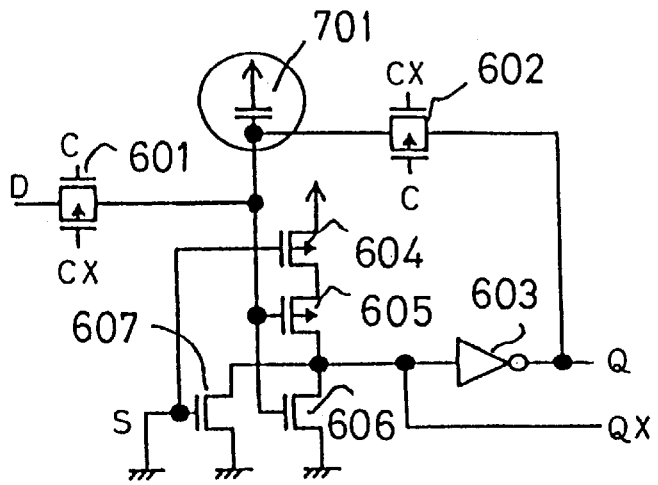
F I G. 7
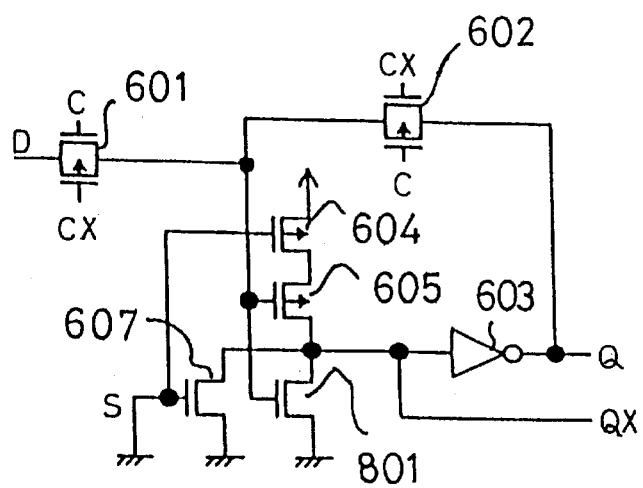
F I G. 8
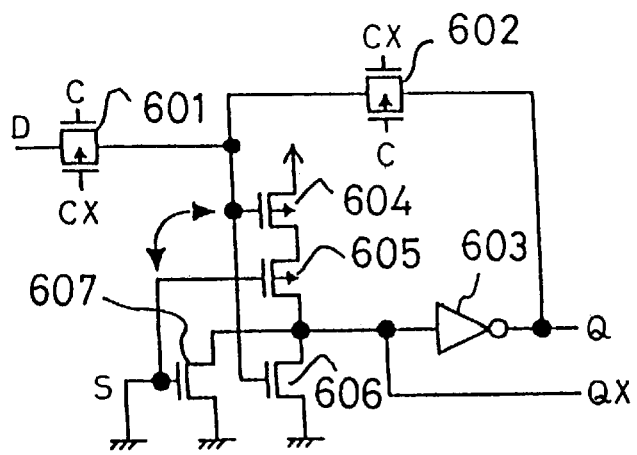
F I G. 9

6,154,070

CONTROL CIRCUIT AND SEMICONDUCTOR INTEGRATED CIRCUIT DEVICE

BACKGROUND OF THE INVENTION

The present invention relates to a control circuit comprising semiconductor elements, particularly a control circuit enabling to control data without depending unstable logic circuit at power turn-on and a semiconductor integrated circuit having the control circuit.

The prior control circuit has controlled with the construction having only one logic circuit connected to two input terminals; output of which is connected to an output terminal as shown in FIG. 5.

However, in the prior control circuit, there has not been any means preventing the logic circuit from outputting wrong data at unstable state of power turn-on because of only one logic circuit.

An object of the present invention is to improve the prior control circuit so as to remove the above-mentioned problem.

SUMMARY OF THE INVENTION

To solve the above problems, the present invention has the following means.

A control circuit of a first means has two logic circuits, as shown in FIG. 1, a first input terminal is connected to the first logic circuit through an inverter circuit and to the second logic circuit directly, and output of the first logic circuit and the second logic circuit are connected to a NOR circuit.

In a second means, a NAND circuit replaces said NOR circuit of the control circuit according to the first means.

In a third means, the first logic circuit of the control circuit according to the first or second means is a flip-flop circuit with set terminal and the second logic circuit of the same is a flip-flop circuit with reset terminal. The first logic circuit is a flip-flop circuit with set terminal, in which a master portion and a slave portion thereof respectively comprises a first transmission gate, a second transmission gate, an inverter circuit, and a NOR circuit; switching polarities of the first transmission gate and the second transmission gate conflict; a first input/output terminal of the first transmission gate, a first input/output terminal of the second transmission gate, and a first input terminal of the NOR circuit are connected; an output terminal of the NOR circuit and an input terminal of the inverter circuit are connected; an output terminal of the inverter circuit and a second input/output terminal of the second transmission gate are connected; and a set signal is input to a second input terminal of the NOR circuit. The second logic circuit is a flip-flop circuit with reset terminal, in which a master portion and a slave portion thereof respectively comprises a first transmission gate, a second transmission gate, an inverter circuit, and NAND circuit; switching polarities of the first transmission gate and the second transmission gate conflict; a first input/output terminal of the first transmission gate, a first input/output terminal of the second transmission gate, and a first input terminal of the NAND circuit are connected; an output terminal of the NAND circuit and an input terminal of the inverter circuit are connected; an output terminal of the inverter circuit and a second input/output terminal of the second transmission gate are connected; and a set signal is input to a second input terminal of the NAND circuit.

A fourth means uses a flip-flop circuit with set terminal in which a first input/output terminal of a capacitor is connected to the connecting point where the first input/output terminal of the first transmission gate, the first input/output terminal of the second transmission gate, and the first input terminal of the NOR circuit are connected; and a second input/output terminal of the capacitor is connected to a power supply voltage in the flip-flop circuit according to the third means.

A fifth means uses a flip-flop circuit with set terminal where L length of N-MOS transistor in which the first input terminal of the NOR circuit comprising the flip-flop circuit with set terminal according to the third means is a gate input is less than other N-MOS transistor for the first logic circuit.

A sixth means uses a flip-flop circuit with set terminal in which the input terminal of the NOR circuit comprising the flip-flop circuit according to the third means is connected to a gate input of P-MOS transistor which a source terminal thereof is connected to power supply voltage in the NOR circuit.

A seventh means uses a flip-flop circuit with set and reset terminals for the first and second logic circuits in the control circuit according to the first or the second means.

In an eighth means, a nonvolatile memory having the control circuit according to any of the first to the seventh means is used for a semiconductor integrated circuit device.

BRIEF DESCRIPTION OF THE DRAWINGS

FIG. 1 is a circuit diagram showing an embodiment of a control circuit.

FIG. 2 is a circuit diagram showing an embodiment of a control circuit.

FIG. 3 is a circuit diagram showing an embodiment of a control circuit.

FIG. 7 is a circuit diagram showing an embodiment of a control circuit.

FIG. 8 is a circuit diagram showing an embodiment of a control circuit.

FIG. 9 is a circuit diagram showing an embodiment of a control circuit.

DETAILED DESCRIPTION OF THE INVENTION

Figure 4:
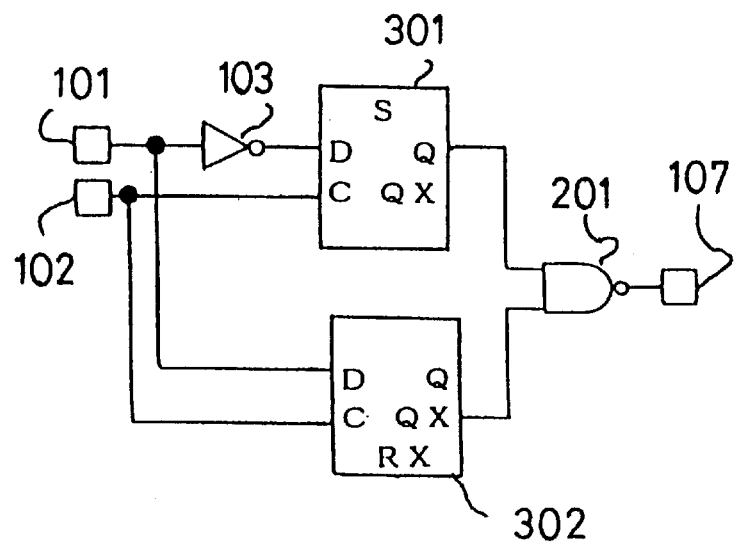
FIG. 4 is a circuit diagram showing an embodiment of a control circuit.
Figure 5:
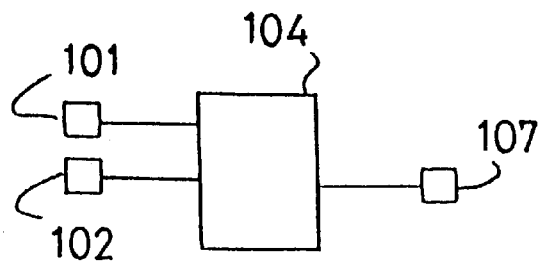
FIG. 5 is a circuit diagram showing the prior control circuit.

The control circuit of the present invention has two logic circuits therein, and takes negative OR or negative AND of output thereof so as to prevent the logic circuit from outputting wrong data at unstable state of power turn-on.

It is suitable for a first mean preventing the logic circuit from outputting wrong data at unstable state of power turn-on that two logic circuits, they are a first logic circuit and a second logic circuit, are used in the control circuit, a first input terminal is connected to the first logic circuit through an inverter circuit and to the second logic circuit directly, and outputs of the first logic circuit and the second logic circuit are connected to a NOR circuit. Although the control circuit of the present invention outputs an expected data ("H" active) when both of the first and second logic circuits output "L" as the control circuit is controlled correctly at stable state after power turn-on, it is indefinite what data is output from the logic circuit in the logic circuit of unstable, uncontrolled state at power turn-on. However, in the state in which two logic circuits are used and the logic circuit of power turn-on is unstable and uncontrolled, opposite data to each other, positive and negative, are output from the two logic circuits, and by taking negative OR, the control circuit prevents the unstable logic circuit of power turn-on from outputting wrong data.

It is suitable for a second mean preventing the logic circuit from outputting wrong data at unstable state of power turn-on that two logic circuits, they are a first logic circuit and a second logic circuit, are used in the control circuit, a first input terminal is connected to the first logic circuit through an inverter circuit and to the second logic circuit directly, and output of the first logic circuit and the second logic circuit are connected to a NAND circuit. Although the control circuit of the present invention outputs an expected data ("L" active) when both of the first and second logic circuits output "H" as the control circuit is controlled correctly at stable state after power turn-on, it is indefinite what data is output from the logic circuit in the logic circuit of unstable, uncontrolled state at power turn-on. However, in the state in which two logic circuits are used and the logic circuit of power turn-on is unstable and uncontrolled, opposite data to each other, positive and negative, are output from the two logic circuits, and by taking negative AND, the control circuit prevents the unstable logic circuit of power turn-on from outputting wrong data.

It is suitable for a third means preventing the logic circuit from outputting wrong data at unstable state of power turn-on that the first logic circuit is a flip-flop circuit with set terminal and the second logic circuit is a flip-flop circuit with reset terminal in the control circuit of said first or second means. The first logic circuit is a flip-flop circuit with set terminal, in which a master portion and a slave portion thereof respectively comprises a first transmission gate, a second transmission gate, an inverter circuit, and NOR circuit; switching polarities of the first transmission gate and the second transmission gate conflict; a first input/output terminal of the first transmission gate, a first input/output terminal of the second transmission gate, and a first input terminal of the NOR circuit are connected; an output terminal of the NOR circuit and an input terminal of the inverter circuit are connected; an output terminal of the inverter circuit and a second input/output terminal of the second transmission gate are connected; and a set signal is input to a second input terminal of the NOR circuit. The second logic circuit is a flip-flop circuit with reset terminal, a master portion and a slave portion thereof respectively comprises a first transmission gate, a second transmission gate, an inverter circuit, and NAND circuit; switching polarities of the first transmission gate and the second transmission gate conflict; a first input/output terminal of the first transmission gate, a first input/output terminal of the second transmission gate, and a first input terminal of the NAND circuit are connected; an output terminal of the NAND circuit and an input terminal of the inverter circuit are connected; an output terminal of the inverter circuit and a second input/output terminal of the second transmission gate are connected; and a reset signal is input to a second input terminal of the NAND circuit. As flip-flop circuits are controlled correctly in stable state after power turn-on, "L" is input to set and reset terminals of flip-flop circuits with set and reset terminals, "L"s are output in the NOR circuit and "H"s are output in the NAND circuit, and expected data ("H" active in the NOR circuit, "L" active in the NAND circuit) are output in the control circuit of the present invention. Although it is indefinite what data is output from the flip-flop circuit in the flip-flop circuit of unstable, uncontrolled state at power turn-on, by using two flip-flop circuits with set terminal and reset terminal, opposite data to each other, positive and negative, are surely output from the two flip-flop circuits in unstable, uncontrolled state of the flip-flop circuits at power turn-on. By taking negative OR or negative AND, the control circuit prevents the unstable logic circuit of power turn-on from outputting wrong data.

A flip-flop circuit with set terminal is suitable to use for the first logic circuit as a fourth means preventing the logic circuit from outputting wrong data at unstable state of power turn-on. In the flip-flop circuit with set terminal according to the third means, a first input/output terminal of a capacitor is connected to the connecting point where the first input/output terminal of the first transmission gate, the first input/output terminal of the second transmission gate, and the first input terminal of the NOR circuit are connected; and a second input/output terminal of the capacitor is connected to a power supply voltage. By connecting the capacitor (about 50 fF), voltage at the connecting point rises, where the first input/output terminal of the first transmission gate, the first input/output terminal of the second transmission gate, and the first input terminal of the NOR circuit are connected in the flip-flop circuit with set terminal. By connecting the capacitor, the coupling between the node of the connecting point and power supply voltage becomes strong. Because of that, the flip-flop circuit with set terminal outputs easily a constant level (Q="H", QX="L") even in unstable, uncontrolled state of the flip-flop circuit at power turn-on, and prevents wrong data from outputting in unstable state of the logic circuit at power turn-on.

A flip-flop circuit with set terminal is suitable to use for the first logic circuit as a fifth means preventing the logic circuit from outputting wrong data at unstable state of power turn-on. In the flip-flop circuit with set terminal according to the third means, L length of N-MOS transistor in which the first input terminal of the NOR circuit is a gate input is less than L length of other N-MOS transistor in said flip-flop circuit with set terminal. By making up L length of the N-MOS transistor to 1.6 µm which is less than L length (2 µm) of the other N-MOS transistor, sub-threshold current of the N-MOS transistor increases. Because of that, the flip-flop circuit with set terminal outputs easily a constant level (Q="H", QX="L") even in unstable, uncontrolled state of the flip-flop circuit at power turn-on, and prevents wrong data from outputting in unstable state of the logic circuit at power turn-on.

A flip-flop circuit with set terminal is suitable to use for the first logic circuit as a sixth means preventing the logic circuit from outputting wrong data at unstable state of power turn-on. In the flip-flop circuit with set according to the third means, the first input terminal of the NOR circuit is connected to a gate input of P-MOS transistor which a source terminal thereof is connected to power supply voltage in the NOR circuit. If the first input terminal of the NOR circuit is connected to a gate input of P-MOS transistor which a source terminal thereof is connected to power supply voltage in the NOR circuit, voltage at the connecting point rises, where the first input/output terminal of the first transmission gate, the first input/output terminal of the second transmission gate, and the first input terminal of the NOR circuit are connected in the flip-flop circuit with set terminal. The coupling between the node of the connecting point and power supply voltage becomes strong. Because of that, the flip-flop circuit with set terminal outputs easily a constant level (Q="H", QX="L") even in unstable, uncontrolled state of the flip-flop circuit at power turn-on, and prevents wrong data from outputting in unstable state of the logic circuit at power turn-on.

In the first and second control circuits according to the first or second means, flip-flop circuits with set and reset terminals are suitable to use for the first logic circuit and the second logic circuit as a seventh means preventing the logic circuit from outputting wrong data at unstable state of power turn-on. The master portion and the slave portion of the flip-flop with set and reset terminals respectively comprises a first transmission gate, a second transmission gate, an inverter circuit, and a complex gate circuit comprising 2 ORs and 2 NANDs; switching polarities of the first transmission gate and the second transmission gate conflict; a first input/output terminal of the first transmission gate, a first input/output terminal of the second transmission gate, and a first input terminal of the OR circuit side of the complex gate circuit comprising 2 ORs and 2 NANDs are connected; an output terminal of the complex gate circuit comprising 2 ORs and 2 NANDs and an input terminal of the inverter circuit are connected; an output terminal of the inverter circuit and a second input/output terminal of the second transmission gate are connected; and a set signal is input to a second input terminal of the OR side of the complex gate circuit comprising 2 ORs and 2 NANDs; and a reset signal is input to a first input terminal of the NAND side of the complex gate circuit comprising 2 ORs and 2 NANDs. It is indefinite what data is output from the flip-flop circuit in unstable, uncontrolled state of the flip-flop circuit at power turn-on. However, by using two flip-flop circuits with set and reset terminals, opposite data, positive and negative each other, are output from Q output of the first flip-flop circuit with set and reset terminals and QX output of the second flip-flop circuit with set and reset terminals as exactly same flip-flop circuits are used even in unstable, uncontrolled state of the flip-flop circuit at power turn-on. By taking negative OR or negative AND, the logic circuit at power turn-on prevents outputting wrong data even in unstable state.

By using a non-volatile memory having the control circuit of the present invention for a semiconductor integrated circuit device, a semiconductor integrated circuit device is obtained, which prevents the logic circuit from unintentional writing on a non-volatile memory at power turn-on.

Referring figures, the embodiments of the present invention will be described below.

In the embodiment of FIG. 1, an input terminal 101 is connected to a logic circuit 104 through an inverter circuit 103, and connected to a logic circuit 105 directly. An input terminal 102 is connected to the logic circuit 104 and the logic circuit 105 directly. Outputs of the logic circuit 104 and the logic circuit 105 are connected to a NOR circuit 106, and output of the NOR circuit 106 is connected to an output terminal 107 so that the control circuit prevents the logic circuit from outputting wrong data at unstable state of power turn-on.

In the embodiment of FIG. 2, an input terminal 101 is connected to a logic circuit 104 through an inverter circuit 103, and connected to a logic circuit 105 directly. An input terminal 102 is connected to the logic circuit 104 and the logic circuit 105 directly. Outputs of the logic circuit 104 and the logic circuit 105 are connected to a NAND circuit 201, and output of the NOR circuit 106 is connected to an output terminal 107 so that the control circuit prevents the logic circuit from outputting wrong data at unstable state of power turn-on.

In the embodiment of FIG. 3, an input terminal 101 is connected to a flip-flop circuit with set terminal 301 through an inverter circuit 103, and connected to a flip-flop circuit with reset terminal 302 directly. The input terminal 102 is directly connected to the flip-flop circuit with set terminal 301 and the flip-flop circuit with reset terminal 302. Outputs of the flip-flop circuit with set terminal 301 and the flip-flop circuit with reset terminal 302 are connected to the NOR circuit 106 or the NAND circuit 201, and output of the NOR circuit 106 or the NAND circuit 201 is connected to an output terminal 107 so that the control circuit prevents the logic circuit from outputting wrong data at unstable state of power turn-on.

FIG. 4 shows a control circuit in which a NAND circuit replaces the NOR circuit of the control circuit shown in the embodiment of FIG. 3.

Figure 6:
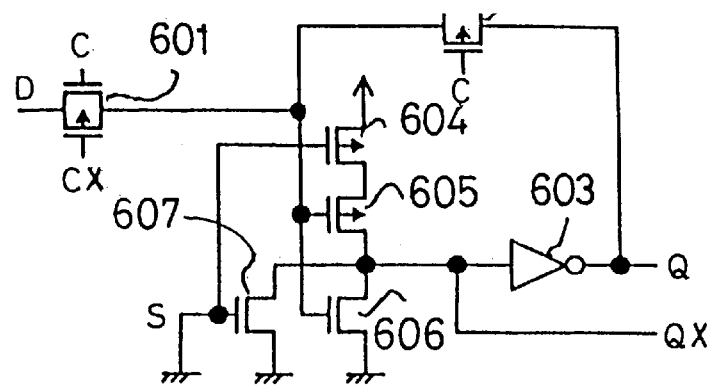
FIG. 6 is an equivalent circuit diagram of the flip-flop circuit with set terminal shown in FIG. 3.

FIG. 6 shows an equivalent circuit of the master portion and the slave portion of the flip-flop circuit with set terminal shown in the embodiment of FIG. 3. Data input through the inverter circuit of FIG. 3 arrives at a transmission gate 602 and gates of a P-MOS transistor 605 and an N-MOS transistor 606 in the NOR circuit. A set signal arrives at gates of a P-MOS transistor 604 and an N-MOS transistor 607. Output of the NOR circuit is QX output, and turns to Q output through an inverter 603. The Q output is connected to a transmission gate 602.

The embodiment shown in FIG. 7 is a flip-flop circuit with set terminal in which a capacitor 701 is connected between the connecting point of the transmission gate 601, the transmission gate 602, and gates of the P-MOS transistor 605 and the N-MOS transistor 606 in the flip-flop circuit with set terminal shown in FIG. 6, and power supply voltage. A control circuit is constructed using the flip-flop circuit with set terminal for the control circuit shown in FIG. 3. A control circuit is formed, in which the logic circuit at power turn-on prevents outputting wrong data even in unstable state.

The embodiment shown in FIG. 8 is a flip-flop circuit with set terminal, in which an N-MOS transistor 801 where L length of the N-MOS transistor 606 of the NOR circuit in the flip-flop circuit with set terminal shown in FIG. 6 is less than other N-MOS transistor replaces the N-MOS transistor 606. A control circuit is constructed using the flip-flop circuit with set terminal used for the control circuit shown in the embodiment of FIG. 3. A control circuit is formed, in which the logic circuit at power turn-on prevents outputting wrong data even in unstable state.

The embodiment shown in FIG. 9 is a flip-flop circuit with set terminal, in which the transmission gate 601, the transmission gate 602, and gates of the P-MOS transistor 604 and the N-MOS transistor 606 of the NOR circuit are connected, and the set signal arrives at gates of P-MOS transistor 605 and the N-MOS transistor 607 of the NOR circuit in the flip-flop circuit with set terminal shown in FIG. 6. A control circuit is constructed using the flip-flop circuit with set terminal used for the control circuit shown in the embodiment of FIG. 3. A control circuit is formed, in which the logic circuit at power turn-on prevents outputting wrong data even in unstable state.

Figure 10:
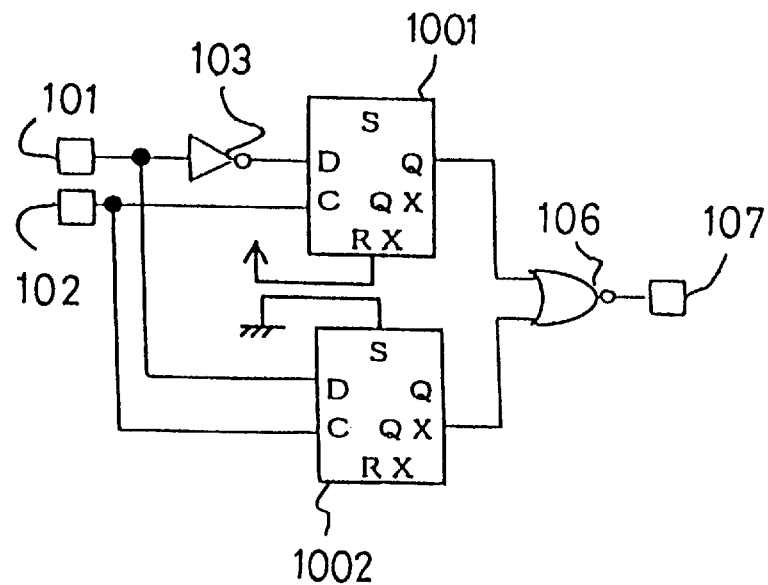
FIG. 10 is a circuit diagram showing an embodiment of a control circuit.

In the embodiment shown in FIG. 10, an input terminal 101 is connected to a flip-flop circuit with set and reset terminals 1001 through an inverter circuit 103, and is connected to a flip-flop circuit with set and reset terminal 1002 directly. An input terminal 102 is connected to the flip-flop circuit with set and reset terminals 1001 and the flip-flop circuit with set and reset terminal 1002 directly. Outputs of the flip-flop circuit with set and reset terminals 1001 and the flip-flop circuit with set and reset terminal 1002 are connected to a NOR circuit 106, and output of the NOR circuit 106 is connected to an output terminal 107. Thus the control circuit is constructed, in which the logic circuit at power turn-on prevents outputting wrong data even in unstable state.

Figure 11:
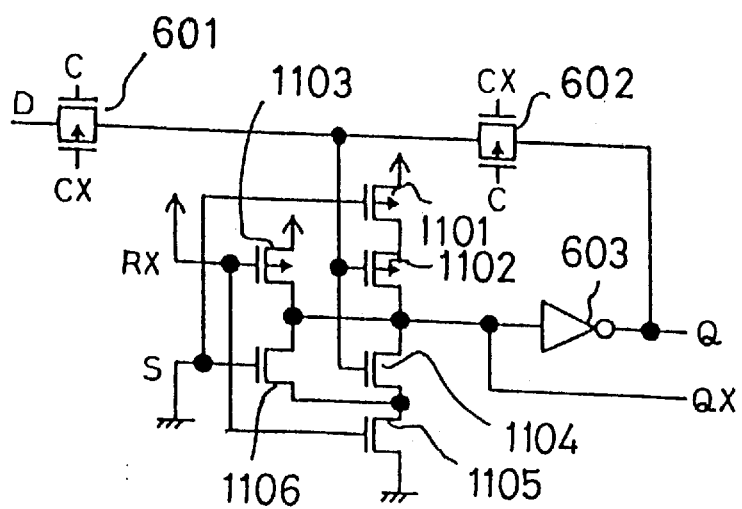
FIG. 11 is an equivalent circuit diagram of the flip-flop circuit with set terminal shown in FIG. 10.

FIG. 11 is an equivalent circuit of the master portion and the slave portion of the flip-flop circuit shown in the embodiment of FIG. 10. Data input through the inverter circuit of FIG. 10 arrives at a transmission gate 602 and gates of a P-MOS transistor 1102 of OR side of a complex gate circuit comprising 2 ORs and 2 NANDs and an N-MOS transistor 1104 through a transmission gate 601. A set signal arrives at gates of a P-MOS transistor 1101 of OR side of a complex gate circuit comprising 2 ORs and 2 NANDs and an N-MOS transistor 1106. A reset signal arrives at gates of a P-MOS transistor 1103 of NAND side of a complex gate circuit comprising 2 ORs and 2 NANDs and an N-MOS transistor 1105. Output of the complex gate circuit comprising 2 ORs and 2 NANDs is QX output, and turns to Q output through the inverter circuit 603. Q output is connected to a transmission gate 602.

The present invention is embodied in above-mentioned manner, and has the following advantages.

The control circuit has two logic circuits therein, and takes negative OR or negative AND of two outputs thereof so as to prevent the logic circuit from outputting wrong data at unstable state of power turn-on. Further, by using a nonvolatile memory having the control circuit of the present invention for a semiconductor integrated circuit device, a semiconductor integrated circuit device is obtained, which prevents the logic circuit from writing unintentionally on a nonvolatile memory at power turn-on.

What is claimed is:

1. A control circuit comprising: a first input terminal; a second input terminal; an inverter circuit; a first logic circuit; a second logic circuit; a logic gate; and an output terminal; wherein the first input terminal is connected to an input of the inverter circuit and a first input of the second logic circuit; the output of the inverter circuit is connected to a first input of the first logic circuit, the second input terminal is connected to a second input of the first logic circuit and a second input of the second logic circuit, outputs of the first logic circuit and the second logic circuit are connected to inputs of the logic gate, the output of the logic gate is connected to the output terminal, and the first logic circuit outputs a first signal and the second logic circuit outputs a second signal that is opposite in logic level from the first signal only when the circuit is in an unstable state, such that when the first signal is at a first logic level the second signal is at a second logic level opposite the first logic level, and when the first signal is at the second logic level the second signal is at the first logic level.

2. A control circuit according to claim 1; wherein the logic gate comprises a NOR gate.

3. A control circuit according to claim 1; wherein the logic gate comprises a NAND gate.

4. A control circuit according to either one of claim 2 and claim 3; wherein the first logic circuit comprises a flip-flop circuit with a set terminal and the second logic circuit comprises a flip-flop circuit with a reset terminal.

5. A control circuit according to claim 4; wherein the flip-flop circuit with a set terminal comprises a master portion and a slave portion comprising a first transmission gate, a second transmission gate, a second inverter circuit, and a second NOR gate, switching polarities of the first transmission gate and the second transmission gate being in conflict, a first input/output terminal of the first transmission gate, a first input/output terminal of the second transmission gate, and a first input terminal of the second NOR gate being connected, an output terminal of the second NOR gate being connected to an input terminal of the second inverter circuit, an output terminal of the second inverter circuit being connected to a second input/output terminal of the second transmission gate, and a set signal being input to a second input terminal of the second NOR gate, and wherein the flip-flop circuit with a reset terminal comprises a master portion and a slave portion comprising a third transmission gate, a fourth transmission gate, a third inverter circuit, and a second NAND gate, switching polarities of the third transmission gate and the fourth transmission gate being in conflict, a first input/output terminal of the third transmission gate, a first input/output terminal of the fourth transmission gate, and a first input terminal of the second NAND gate being connected, an output terminal of the second NAND gate being connected to an input terminal of the third inverter circuit, an output terminal of the third inverter circuit being connected to a second input/output terminal of the fourth transmission gate, and a set signal being input to a second input terminal of the second NAND gate.

6. A control circuit according to claim 5; wherein at least one of the flip-flop circuits further comprises a capacitor having a first terminal connected to the connecting point at which the transmission gates and the logic gate circuit are connected, and a second terminal connected to a power supply voltage.

7. A control circuit according to claim 5; wherein the flip-flop circuit with a set terminal further comprises an N-MOS transistor having a gate electrode connected to the second NOR gate, a channel (L) length of the N-MOS transistor being smaller than an L length of another N-MOS transistor in the flip-flop circuit with a set terminal.

8. A control circuit according to claim 5; wherein the first input terminal of the second NOR gate is connected to a gate input of a P-MOS transistor having a source terminal connected to a power supply voltage of the second NOR circuit.

9. A control circuit according to either one of claim 2 and claim 3; wherein the first logic circuit comprises a first flip-flop circuit with set and reset terminals, and the second logic circuit comprises a second flip-flop circuit with set and reset terminals.

10. A control circuit according to claim 9; wherein the first and second flip-flop circuits each comprise a master portion and a slave portion comprising a first transmission gate, a second transmission gate, a second inverter circuit, and a complex gate circuit comprising 2 OR gates and 2 NAND gates, switching polarities of the first transmission gate and the second transmission gate being in conflict, a first input/output terminal of the first transmission gate, a first input/output terminal of the second transmission gate, and a first input terminal of an OR gate of the complex gate circuit are connected, an output terminal of the complex gate circuit is connected to an input terminal of the second inverter circuit, an output terminal of the second inverter circuit is connected to a second input/output terminal of the second transmission gate; and a set signal is input to a second input terminal of an OR gate of the complex gate circuit, and a reset signal is input to a first input terminal of a NAND gate of the complex gate circuit.

11. A semiconductor integrated circuit device for preventing unintentional writing in a nonvolatile memory at power turn-on using the control circuit according to claim 1.

12. A control circuit comprising: a first input terminal; a second input terminal; an inverter circuit for inverting a signal applied to the first input terminal; a first logic circuit for receiving signals from the second input terminal and the inverter and producing a first output signal in accordance therewith; a second logic circuit for receiving signals from the first and second input terminals and producing a second output signal in accordance therewith; and a logic gate for performing a logical operation on the first and second output signals; wherein the second output signal has an opposite logic level from the first output signal only when the circuit is in an unstable state, such that when the first output signal is at a first logic level, the second output signal is at a second logic level opposite the first logic level, and when the first output signal is at the second logic level, the second output signal is at the first logic level, thereby preventing the control circuit from outputting erroneous data during an unstable state at a power-on time of the circuit.

13. A control circuit according to claim 12; wherein the logic gate comprises a NOR gate.

14. A control circuit according to claim 13; wherein the first logic circuit comprises a flip-flop circuit with a set terminal and the second logic circuit comprises a flip-flop circuit with a reset terminal.

15. A control circuit according to claim 12; wherein the logic gate comprises a NAND gate.

16. A control circuit according to claim 15; wherein the first logic circuit comprises a flip-flop circuit with a set terminal and the second logic circuit comprises a flip-flop circuit with a reset terminal.

17. A control circuit according to claim 12; wherein the first logic circuit comprises a flip-flop circuit with a set terminal and the second logic circuit comprises a flip-flop circuit with a reset terminal, the flip-flop circuit with a set terminal comprising a first transmission gate, a second transmission gate, an inverter circuit, and a NOR gate, switching polarities of the first transmission gate and the second transmission gate being in conflict, a first terminal of the first transmission gate, a first terminal of the second transmission gate, and a first input terminal of the NOR gate being connected, an output terminal of the NOR gate being connected to an input terminal of the inverter circuit, an output terminal of the inverter circuit being connected to a second terminal of the second transmission gate, and a set signal being input to a second input terminal of the NOR circuit.

18. A control circuit according to claim 17; wherein the flip-flop circuit with a set terminal further comprises a capacitor having a first terminal connected to the connecting point at which the first terminal of the first transmission gate, the first terminal of the second transmission gate, and the first input terminal of the NOR circuit are connected, and a second terminal connected to a power supply voltage.

19. A control circuit according to claim 17; wherein the flip-flop circuit with a set terminal further comprises an N-MOS transistor having a gate electrode connected to the second NOR gate, a channel length of the N-MOS transistor being smaller than a channel length of another N-MOS transistor in the flip-flop circuit with a set terminal.

20. A control circuit according to claim 17; wherein the first input terminal of the NOR gate is connected to a gate input of P-MOS transistor having a source terminal connected to a power supply voltage of the NOR gate.

21. A control circuit according to claim 17; wherein the flip-flop circuit with a reset terminal comprises a first transmission gate, a second transmission gate, an inverter circuit, and a NAND gate, switching polarities of the first transmission gate and the second transmission gate being in conflict, a first terminal of the first transmission gate, a first terminal of the second transmission gate, and a first input terminal of the NAND gate being connected, an output terminal of the NAND gate being connected to an input terminal of the inverter circuit, an output terminal of the inverter circuit being connected to a second terminal of the second transmission gate, and a set signal being input to a second input terminal of the NAND gate.

22. A control circuit according to claim 12; wherein the first logic circuit comprises a first flip-flop circuit with set and reset terminals, and the second logic circuit comprises a second flip-flop circuit with set and reset terminals.

23. A control circuit according to claim 22; wherein the first and second flip-flop circuits each comprise a first transmission gate, a second transmission gate, a second inverter circuit, and a complex gate circuit comprising 2 OR gates and 2 NAND gates, switching polarities of the first transmission gate and the second transmission gate being in conflict, a first input/output terminal of the first transmission gate, a first input/output terminal of the second transmission gate, and a first input terminal of an OR gate of the complex gate circuit are connected, an output terminal of the complex gate circuit is connected to an input terminal of the second inverter circuit, an output terminal of the second inverter circuit is connected to a second input/output terminal of the second transmission gate; and a set signal is input to a second input terminal of an OR gate of the complex gate circuit, and a reset signal is input to a first input terminal of a NAND gate of the complex gate circuit.

24. A semiconductor integrated circuit device for preventing unintentional writing in a nonvolatile memory at the time of power-on having a control circuit according to claim 12.

25. A control circuit comprising: a first logic circuit for producing a first output signal in accordance with an input signal; a second logic circuit for producing an output signal in accordance with an input signal; and a logic gate for performing a logical operation on the first and second output signals; wherein the second output signal has an opposite logic level from the first output signal only when the circuit is in an unstable state, such that when the first output signal is at a first logic level, the second output signal is at a second logic level opposite the first logic level, and when the first output signal is at the second logic level, the second output signal is at the first logic level, thereby preventing the control circuit from outputting erroneous data during an unstable state at a power on time of the circuit.

26. A control circuit according to claim 25; further comprising a first input terminal; a second input terminal; and an inverter circuit for inverting a signal applied to the first input terminal; wherein output signals from the second input terminal and the inverter are supplied to the first logic circuit, which produces the first output signal in accordance therewith, and output signals from the first and second input terminals are supplied to the second logic circuit, which produces the second output signal in accordance therewith.

27. A control circuit according to claim 25; wherein the logic gate comprises a NOR gate.

28. A control circuit according to claim 27; wherein the first logic circuit comprises a flip-flop circuit with a set terminal and the second logic circuit comprises a flip-flop circuit with a reset terminal.

29. A control circuit according to claim 25; wherein the logic gate comprises a NAND gate.

30. A control circuit according to claim 29; wherein the first logic circuit comprises a flip-flop circuit with a set terminal and the second logic circuit comprises a flip-flop circuit with a reset terminal.

31. A control circuit according to claim 25; wherein the first logic circuit comprises a flip-flop circuit with a set terminal and the second logic circuit comprises a flip-flop circuit with a reset terminal, the flip-flop circuit with a set terminal comprising a first transmission gate, a second transmission gate, an inverter circuit, and a NOR gate, switching polarities of the first transmission gate and the second transmission gate being in conflict, a first terminal of the first transmission gate, a first terminal of the second transmission gate, and a first input terminal of the NOR gate being connected, an output terminal of the NOR gate being connected to an input terminal of the inverter circuit, an output terminal of the inverter circuit being connected to a second terminal of the second transmission gate, and a set signal being input to a second input terminal of the NOR circuit.

32. A control circuit according to claim 31; wherein the flip-flop circuit with a set terminal further comprises a capacitor having a first terminal connected to the connecting point at which the first terminal of the first transmission gate, the first terminal of the second transmission gate, and the first input terminal of the NOR circuit are connected, and a second terminal connected to a power supply voltage.

33. A control circuit according to claim 31; wherein the flip-flop circuit with a set terminal further comprises an N-MOS transistor having a gate electrode connected to the second NOR gate, a channel length of the N-MOS transistor being smaller than a channel length of another N-MOS transistor in the flip-flop circuit with a set terminal.

34. A control circuit according to claim 31; wherein the first input terminal of the NOR gate is connected to a gate input of P-MOS transistor having a source terminal connected to a power supply voltage of the NOR gate.

35. A control circuit according to claim 31; wherein the flip-flop circuit with a reset terminal comprises a first transmission gate, a second transmission gate, an inverter circuit, and a NAND gate, switching polarities of the first transmission gate and the second transmission gate being in conflict, a first terminal of the first transmission gate, a first terminal of the second transmission gate, and a first input terminal of the NAND gate being connected, an output terminal of the NAND gate being connected to an input terminal of the inverter circuit, an output terminal of the inverter circuit being connected to a second terminal of the second transmission gate, and a set signal being input to a second input terminal of the NAND gate.

36. A control circuit according to claim 25; wherein the first logic circuit comprises a first flip-flop circuit with set and reset terminals, and the second logic circuit comprises a second flip-flop circuit with set and reset terminals.

37. A control circuit according to claim 36; wherein the first and second flip-flop circuits each comprise a first transmission gate, a second transmission gate, a second inverter circuit, and a complex gate circuit comprising 2 OR gates and 2 NAND gates, switching polarities of the first transmission gate and the second transmission gate being in conflict, a first input/output terminal of the first transmission gate, a first input/output terminal of the second transmission gate, and a first input terminal of an OR gate of the complex gate circuit are connected, an output terminal of the complex gate circuit is connected to an input terminal of the second inverter circuit, an output terminal of the second inverter circuit is connected to a second input/output terminal of the second transmission gate; and a set signal is input to a second input terminal of an OR gate of the complex gate circuit, and a reset signal is input to a first input terminal of a NAND gate of the complex gate circuit.

38. A semiconductor integrated circuit device for preventing unintentional writing in a nonvolatile memory at the time of power-on having a control circuit according to claim 25.

* * * * *